United States Patent
Yang et al.

(10) Patent No.: US 10,109,793 B2
(45) Date of Patent: *Oct. 23, 2018

(54) BOTTOM ELECTRODE FOR RRAM STRUCTURE

(71) Applicant: Taiwan Semiconductor Manufacturing Co., Ltd., Hsin-Chu (TW)

(72) Inventors: Jen-Sheng Yang, Keelung (TW); Wen-Ting Chu, Kaohsiung (TW); Yu-Wen Liao, New Taipei (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 15/275,554

(22) Filed: Sep. 26, 2016

(65) Prior Publication Data

US 2017/0141305 A1  May 18, 2017

Related U.S. Application Data

(63) Continuation of application No. 14/940,442, filed on Nov. 13, 2015, now Pat. No. 9,461,245.

(51) Int. Cl.
*H01L 27/24* (2006.01)
*H01L 45/00* (2006.01)

(52) U.S. Cl.
CPC ...... *H01L 45/1253* (2013.01); *H01L 27/2436* (2013.01); *H01L 27/2463* (2013.01); *H01L 27/2481* (2013.01); *H01L 45/04* (2013.01); *H01L 45/1233* (2013.01); *H01L 45/14* (2013.01); *H01L 45/146* (2013.01); *H01L 45/1608* (2013.01); *H01L 45/1675* (2013.01)

(58) Field of Classification Search
CPC . H01L 45/04; H01L 27/2463; H01L 27/2481; H01L 45/14
See application file for complete search history.

(56) References Cited

U.S. PATENT DOCUMENTS

| | | | |
|---|---|---|---|
| 9,461,245 B1* | 10/2016 | Yang | H01L 45/1253 |
| 9,553,265 B1* | 1/2017 | Yang | H01L 45/1253 |
| 2007/0252127 A1 | 11/2007 | Arnold et al. | |
| 2008/0308784 A1 | 12/2008 | Oh et al. | |
| 2008/0315174 A1 | 12/2008 | Kang et al. | |
| 2009/0200640 A1 | 8/2009 | Hosoi et al. | |
| 2014/0027701 A1 | 1/2014 | Lee et al. | |
| 2014/0183434 A1 | 7/2014 | Lim et al. | |

(Continued)

OTHER PUBLICATIONS

Notice of Allowance dated May 31, 2016 for U.S. Appl. No. 14/940,442.

*Primary Examiner* — Ngan Ngo
(74) *Attorney, Agent, or Firm* — Eschweiler & Potashnik, LLC

(57) ABSTRACT

The present disclosure relates to a memory cell having a multi-layer bottom electrode with an insulating core that provides for good gap fill ability, and an associated method of formation. In some embodiments, the memory cell includes a bottom electrode having an insulating material surrounded by a conductive material. A dielectric data storage layer is arranged over the bottom electrode, and a top electrode is arranged over the dielectric data storage layer.

20 Claims, 8 Drawing Sheets

(56) References Cited

U.S. PATENT DOCUMENTS

| | | |
|---|---|---|
| 2015/0263279 A1 | 9/2015 | Hayakawa et al. |
| 2015/0295172 A1 | 10/2015 | Sung et al. |
| 2015/0349073 A1 | 12/2015 | Kang |
| 2016/0013405 A1 | 1/2016 | Kim |
| 2016/0049584 A1 | 2/2016 | Dang et al. |
| 2016/0087035 A1 | 3/2016 | Kim et al. |
| 2016/0104841 A1 | 4/2016 | Ahn |
| 2017/0077180 A1* | 3/2017 | Ito ................ H01L 27/2454 |

* cited by examiner

BOTTOM ELECTRODE FOR RRAM STRUCTURE

REFERENCE TO RELATED APPLICATION

This Application is a Continuation of U.S. application Ser. No. 14/940,442 filed on Nov. 13, 2015, the contents of which is hereby incorporated by reference in its entirety.

BACKGROUND

Many modern day electronic devices contain electronic memory configured to store data. Electronic memory may be volatile memory or non-volatile memory. Volatile memory stores data while it is powered, while non-volatile memory is able to store data when power is removed. Resistive random access memory (RRAM) is one promising candidate for next generation non-volatile memory technology due to its simple structure and CMOS logic compatible process technology that is involved. An RRAM cell includes a dielectric data storage layer having a variable resistance, which is placed between two electrodes disposed within back-end-of-the-line (BEOL) metallization layers.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
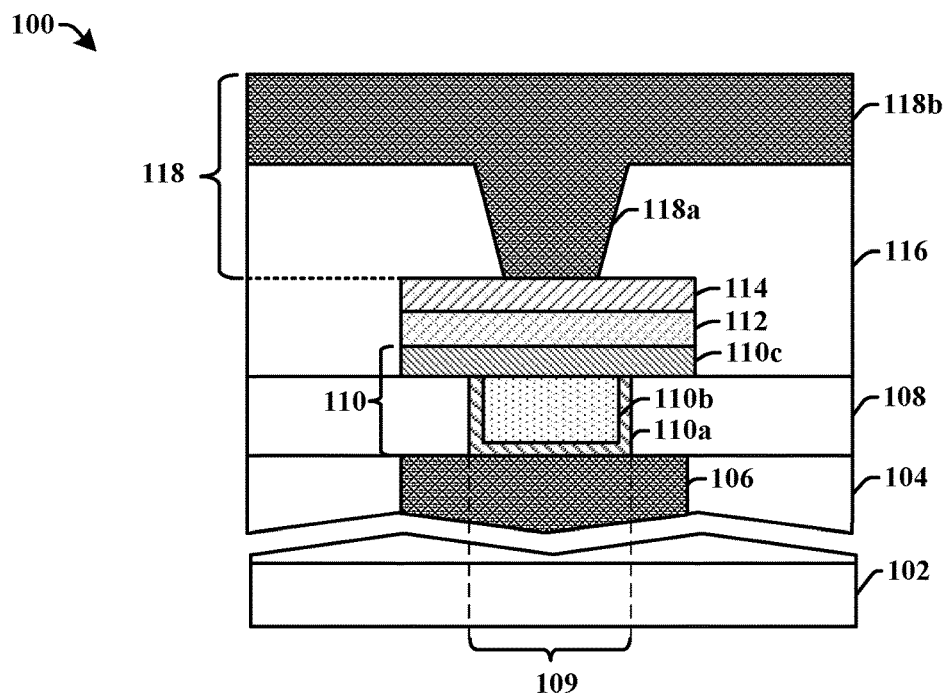
FIG. 1 illustrates a cross-sectional view of some embodiments of an RRAM (resistive random access memory) cell having a multi-layer bottom electrode with an insulating core.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In recent years, resistive random access memory (RRAM) cells have emerged as a promising candidate for a next generation of electronic data storage. An RRAM cell comprises a conductive bottom electrode separated from a conductive top electrode by a dielectric data storage layer having a variable resistance. The RRAM cell stores data based upon resistive switching, which allows for the RRAM cell to change the electrical resistance of a memory cell between a high resistive state corresponding to a first data state (e.g., a "0") and a low resistive state corresponding to a second data state (e.g., a "1").

The conductive bottom electrode of an RRAM cell is typically formed by etching an opening within a dielectric layer and then forming a bottom electrode that extends into the opening. However, it has been appreciated that as the size of RRAM cells continue to decrease, the bottom electrode metal often fails to properly fill the opening in the dielectric layer. This results in a depression within an upper surface of the bottom electrode, which may lead to non-planar topographies for the overlying layers. The non-planar topographies can negatively affect the ability of an RRAM cell to store data and the reliability of an RRAM cell.

The present disclosure relates to an RRAM cell having a multi-layer bottom electrode with an insulating core that provides for good gap fill ability, and an associated method of formation. In some embodiments, the RRAM cell has a multi-layer bottom electrode with an insulating bottom electrode (BE) layer arranged laterally between sidewalls of a conductive lower BE layer and vertically between the conductive lower BE layer and a conductive upper BE layer. A dielectric data storage layer having a variable resistance is arranged over the multi-layer bottom electrode, and a top electrode is arranged over the dielectric data storage layer. The insulating core of the multi-layer bottom electrode is better able to fill gaps with large aspect ratios than conductive materials, thereby giving the bottom electrode a planar upper surface that avoids topography problems in overlying layers.

FIG. 1 illustrates a cross-sectional view of some embodiments of an RRAM (resistive random access memory) cell 100 having a multi-layer bottom electrode with an insulating core.

The RRAM cell 100 comprises a lower inter-level dielectric (ILD) layer 104 arranged over a semiconductor substrate 102. A lower metal interconnect layer 106 is surrounded by the lower ILD layer 104. In some embodiments, a lower insulating layer 108 is located over the lower ILD layer 104 and/or the lower metal interconnect layer 106. The lower insulating layer 108 comprises an opening 109 or microtrench that extends through the lower insulating layer 108 to the lower metal interconnect layer 106.

A multi-layer bottom electrode 110 is located over the lower metal interconnect layer 106. The multi-layer bottom electrode 110 has an insulating core that is surrounded by (i.e., embedded within) conductive materials. The multi-layer bottom electrode 110 extends from within the opening 109 to locations overlying the lower insulating layer 108 on opposing sides of the opening 109. In some embodiments, the multi-layer bottom electrode 110 comprises a conductive lower BE layer 110a, an insulating BE layer 110b, and a conductive upper BE layer 110c. The conductive lower BE layer 110a is arranged within the opening 109 in the lower insulating layer 108. The insulating BE layer 110b is arranged between sidewalls of the conductive lower BE layer 110a. The conductive upper BE layer 110c is arranged over the conductive lower BE layer 110a and the insulating BE layer 110b.

A dielectric data storage layer 112 is arranged over the multi-layer bottom electrode 110. The dielectric data storage layer 112 has a variable resistance, having a resistive value that changes depending on an applied voltage. A top electrode 114 is positioned over the dielectric data storage layer 112. During operation of the RRAM cell, voltages applied to the multi-layer bottom electrode 110 and the top electrode 114 will generate an electric field that extends into the dielectric data storage layer 112. The electric field acts upon oxygen vacancies within the dielectric data storage layer 112, inducing conductive paths (e.g., comprising the oxygen vacancies) to form across the dielectric data storage layer 112. Depending on the applied voltages, the dielectric data storage layer 112 will undergo a reversible change between a high resistance state associated with a first data state (e.g., a '0') and a low resistance state associated with a second data state (e.g., a '1').

The insulating BE layer 110b of the multi-layer bottom electrode 110 is better able to fill gaps with large aspect ratios than conductive materials. This allows for the insulating BE layer 110b to fill the opening 109 in the lower insulating layer 108, thereby giving the conductive upper BE layer 110c a flat upper surface that allows the dielectric data storage layer 112 and the top electrode 114 to have a planar topography that provides the RRAM cell 100 with good performance and reliability.

Figure 2:
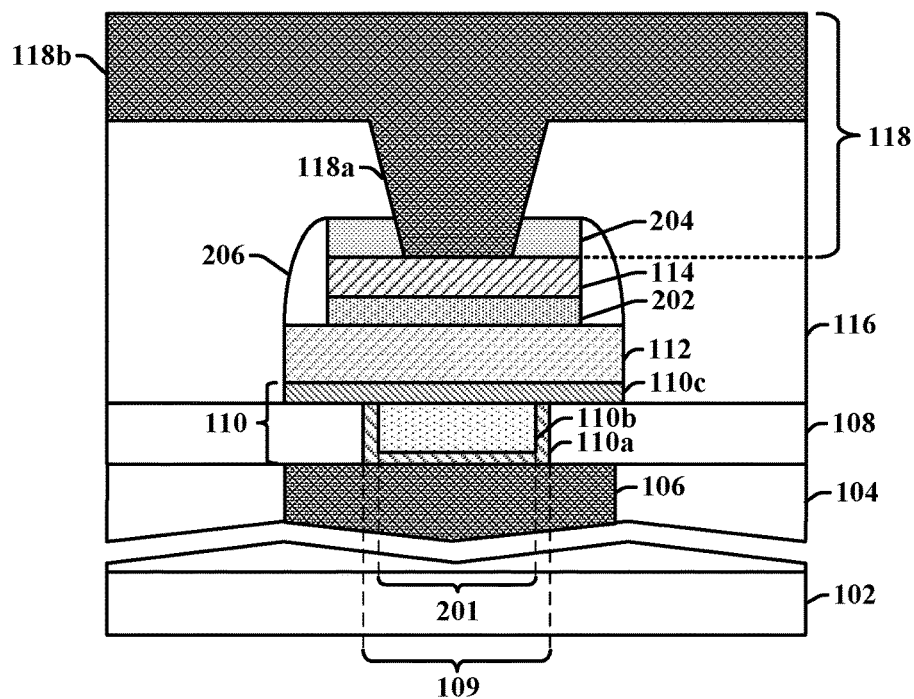
FIG. 2 illustrates a cross-sectional view of some additional embodiments of an RRAM cell comprising a multi-layer bottom electrode with an insulating core.

FIG. 2 illustrates a cross-sectional view of some additional embodiments of an RRAM cell 200 comprising a multi-layer bottom electrode with an insulating core.

The RRAM cell 200 comprises a lower insulating layer 108 arranged over a lower metal interconnect layer 106 surrounded by a lower ILD layer 104. A multi-layer bottom electrode 110 with an insulating core is disposed over the lower metal interconnect layer 106. In some embodiments, the lower metal interconnect layer 106 may comprise one of a plurality of metal interconnect layers disposed between the multi-layer bottom electrode 110 and an underlying semiconductor substrate 102.

The multi-layer bottom electrode 110 comprises a conductive lower BE layer 110a, an insulating BE layer 110b, and a conductive upper BE layer 110c. The conductive lower BE layer 110a may comprise a 'U' shaped layer having a cavity 201 within an upper surface of the conductive lower BE layer 110a. In some embodiments, the conductive lower BE layer 110a may abut the lower metal interconnect layer 106 and the lower insulating layer 108. In other embodiments, a diffusion barrier layer (not shown) may be disposed between the conductive lower BE layer 110a the lower metal interconnect layer 106 and/or the lower insulating layer 108. In some embodiments, the diffusion barrier may comprise a conductive oxide, nitride, or oxynitride of a metal such as aluminum (Al), manganese (Mn), cobalt (Co), titanium (Ti), tantalum (Ta), tungsten (W), nickel (Ni), tin (Sn), magnesium (Mg), and combinations thereof.

The insulating BE layer 110b is arranged over the conductive lower BE layer 110a along a center line bisecting the opening 109 in the lower insulating layer 108. The insulating BE layer 110b may be nested within the cavity 201 of the 'U' shape of the conductive lower BE layer 110a. For example, the insulating BE layer 110b may be confined within and fill the cavity 201, so that the conductive lower BE layer 110a and the insulating BE layer 110b have planar upper surfaces that are aligned along a substantially planar horizontal surface. The conductive upper BE layer 110c is arranged over the conductive lower BE layer 110a and the insulating BE layer 110b. In some embodiments, the conductive upper BE layer 110c directly contacts upper surfaces of the conductive lower BE layer 110a and the insulating BE layer 110b. In some embodiments, the conductive upper BE layer 110c may laterally extend past sidewalls of the conductive lower BE layer 110a, so that the conductive upper BE layer 110c overlies the lower insulating layer 108.

The conductive lower BE layer 110a comprises a first conductive material. In some embodiments, the first conductive material may comprise titanium (Ti), titanium nitride (TiN), tantalum (Ta), tantalum nitride (TaN), tungsten (W), copper (Cu), etc. The insulating BE layer 110b comprises an insulating material. In some embodiments, the insulating material may comprise an oxide or a silicon rich oxide (SRO). The conductive upper BE layer 110c comprises a second conductive material. In some embodiments, the second conductive material may comprise Ti, TiN, Ta, TaN, W, Cu, etc. In various embodiments, the first and second conductive materials may comprise a same material or different materials.

A dielectric data storage layer 112 is arranged over the multi-layer bottom electrode 110. In some embodiments, the dielectric data storage layer 112 may directly contact an upper surface of the conductive upper BE layer 110c. The dielectric data storage layer 112 may comprise a substantially planar layer. In various embodiments, the dielectric data storage layer 112 may comprise a high-k dielectric material. For example, the dielectric data storage layer 112 may comprise hafnium oxide (HfOx) nickel oxide (NiO$_x$), tantalum oxide (Ta$_y$O$_x$), titanium oxide (TiO$_x$), tungsten oxide (WO$_x$), zirconium oxide (ZrO$_x$), and/or other similar materials.

In some embodiments, a capping layer 202 may be disposed onto the dielectric data storage layer 112. The capping layer 202 is configured to store oxygen, which can facilitate resistance changes within the dielectric data storage layer 112. In some embodiments, the capping layer 202 may comprise a metal or a metal oxide that is relatively low in oxygen concentration.

A top electrode 114 is disposed onto the capping layer 202. The top electrode 114 comprises a conductive material, such as Ti, TiN, Ta, TaN, W, Cu, etc. A masking layer 204 may be disposed over the top electrode 114. In some embodiments, the masking layer 204 may comprise a silicon oxy-nitride (SiON) hard mask layer, a silicon dioxide (SiO$_2$) hard mask layer, or a PE-SiN hard mask. In some embodiments, sidewall spacers 206 are disposed on opposing sides of the capping layer 202, the top electrode 114, and the masking layer 204.

An upper ILD layer 116 is disposed over the masking layer 204. The upper ILD layer 116 surrounds an upper metal interconnect layer 118. The upper metal interconnect layer 118 comprises the upper metal via 118a, which extends through the masking layer 204 between the top electrode 114 and an upper metal wire 118b.

Figure 3:
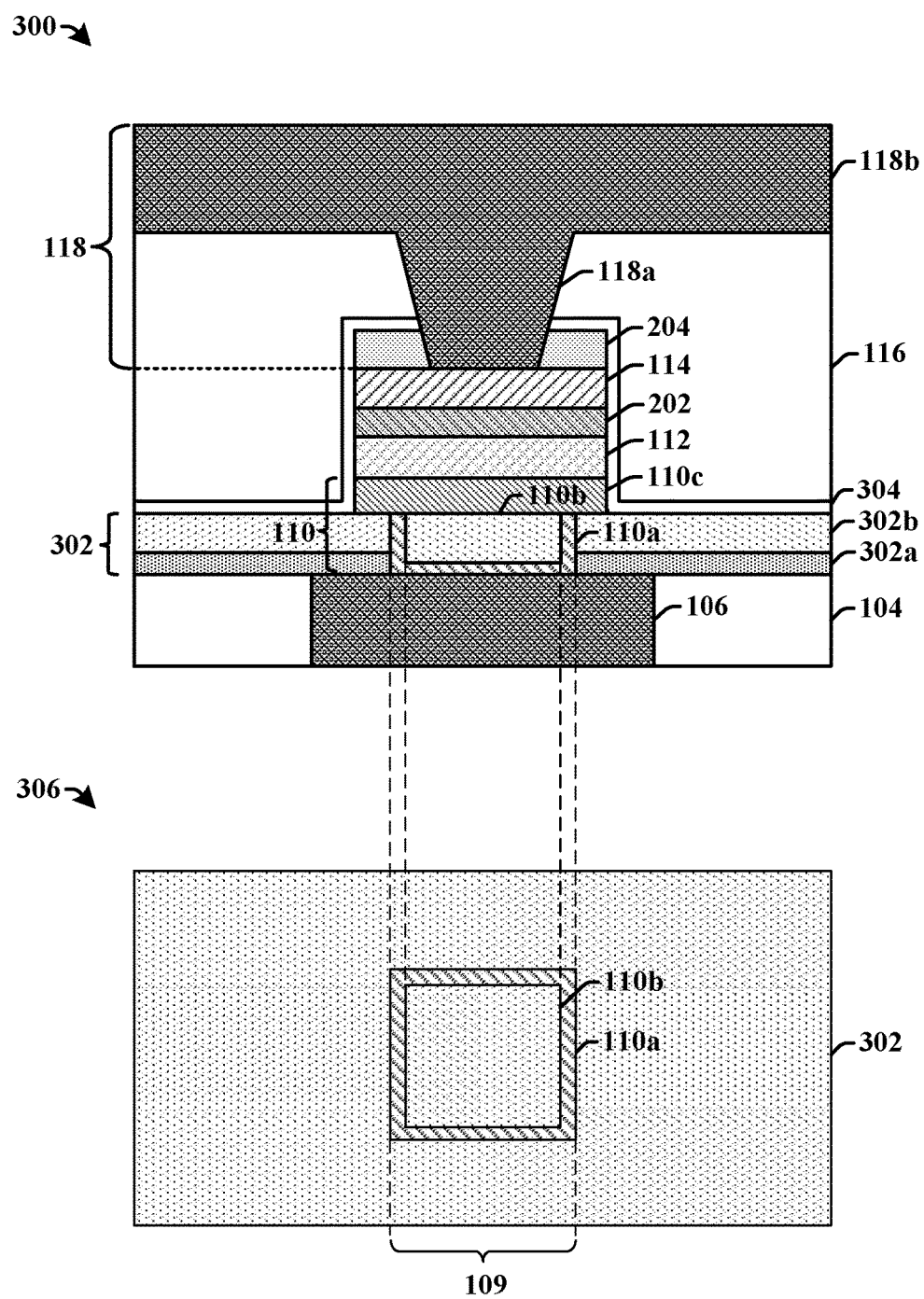
FIG. 3 illustrates some additional embodiments of an RRAM cell comprising a multi-layer bottom electrode having an insulating core.

FIG. 3 illustrates some additional embodiments of an RRAM cell 300 comprising a multi-layer bottom electrode with an insulating core.

The RRAM cell 300 comprises a multi-layer lower insulating layer 302 arranged over a lower metal interconnect layer 106 surrounded by a lower ILD layer 104. In some embodiments, the multi-layer lower insulating layer 302 may comprise a first insulating material 302a arranged over the lower ILD layer 104 and a second insulating material 302b arranged over the first insulating material 302a. In some embodiments, the first insulating material 302a and the second insulating material 302b may comprise an oxide, a silicon rich oxide, silicon carbide (SiC), silicon nitride (SiN), etc. In some embodiments, the first insulating material 302a may be a different material than the second insulating material 302b.

An opening extends through the first insulating material 302a and the second insulating material 302b. A multi-layer bottom electrode 110 extends from within the opening 109 to a location overlying the multi-layer lower insulating layer 302. In some embodiments, the multi-layer bottom electrode 110 comprises a conductive lower BE layer 110a, an insulating BE layer 110b, and a conductive upper BE layer 110c. The conductive lower BE layer 110a may extend along sidewalls of the first insulating material 302a and the second insulating material 302b. The conductive upper BE layer 110c may be vertically separated from the first insulating material 302a by the second insulating material 302b. In some embodiments, the conductive upper BE layer 110c contacts the second insulating material 302b. In some embodiments, the insulating BE layer 110b may be a same material as the second insulating material 302b.

The multi-layer bottom electrode 110 is separated from a top electrode 114 by a dielectric data storage layer 112 and a capping layer 202. In some embodiments, a top dielectric layer 304 may be disposed onto a masking layer 204 arranged over the top electrode 114. The top dielectric layer 304 continuously extends along sidewalls of the dielectric data storage layer 112, the capping layer 202, the top electrode 114, and the masking layer 204, from a first position abutting a top surface of the masking layer 204 to a second position abutting a top surface of the second insulating material 302b. The top dielectric layer 304 separates the dielectric data storage layer 112, the capping layer 202, the top electrode 114, and the masking layer 204 from an upper inter-level dielectric (ILD) layer 116.

As shown in top-view 306, the conductive lower BE layer 110a may be arranged around sidewalls of the opening 109 in the multi-layer lower insulating layer 302. The insulating BE layer 110b is separated from the sidewalls of the multi-layer lower insulating layer 302 by the conductive lower BE layer 110a. This causes the conductive lower BE layer 110a to form a ring around the insulating BE layer 110b, which laterally separates the insulating BE layer 110b from the multi-layer lower insulating layer 302.

Figure 4:
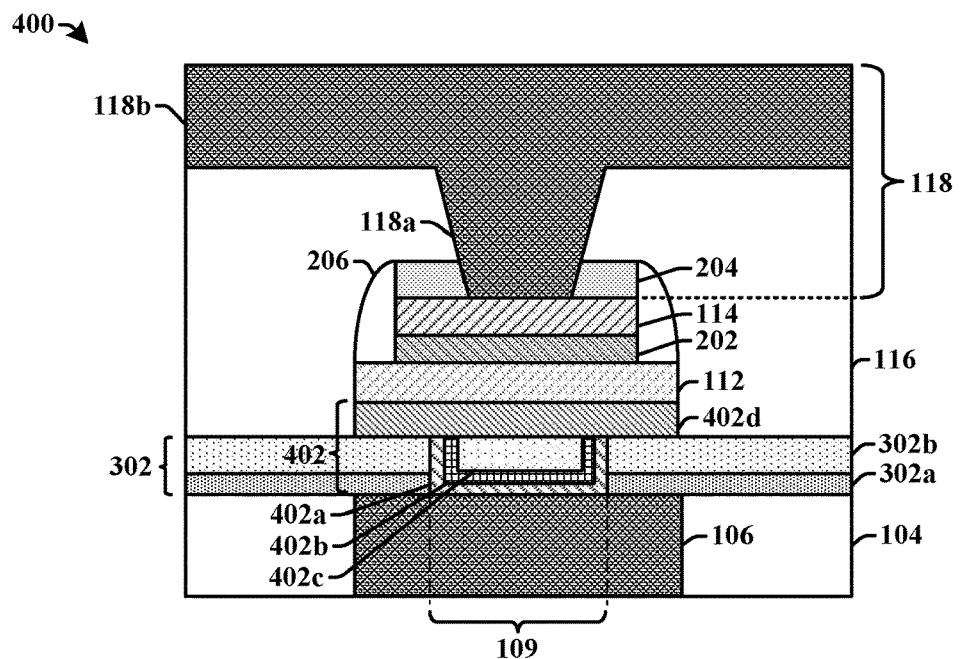
FIG. 4 illustrates a cross-sectional view of some alternative embodiments of an RRAM cell comprising a multi-layer bottom electrode having an insulating core.

Although the multi-layer bottom electrode has been illustrated above as having three layers, it will be appreciated that the multi-layer bottom electrode may comprise additional layers in various embodiments. For example, FIG. 4 illustrates a cross-sectional view of some alternative embodiments of an RRAM cell 400 comprising a multi-layer bottom electrode having four layers.

The RRAM cell 400 comprises a multi-layer bottom electrode 402 having a first conductive lower BE layer 402a arranged onto bottom and sidewall surfaces of an opening 109 in a multi-layer lower insulating layer 302 arranged onto a lower ILD layer 104. An insulating BE layer 402c is vertically and laterally separated from the first conductive lower BE layer 402a by a second conductive lower BE layer 402b arranged onto bottom and sidewall surfaces of the first conductive lower BE layer 402a. The first conductive lower BE layer 402a, the second conductive lower BE layer 402b, and the insulating BE layer 402c have planar upper surfaces that are vertically aligned along a substantially planar horizontal surface. A conductive upper BE layer 402d is arranged onto the first conductive lower BE layer 402a, the second conductive lower BE layer 402b, and the insulating BE layer 402c. In some embodiments, the first conductive lower BE layer 402a may comprise a titanium nitride (TiN), the second conductive lower BE layer 402b may comprise tantalum nitride (TaN), the insulating BE layer 402c may comprise SRO, and the conductive upper BE layer 402d may comprise TiN, for example.

Figure 5:
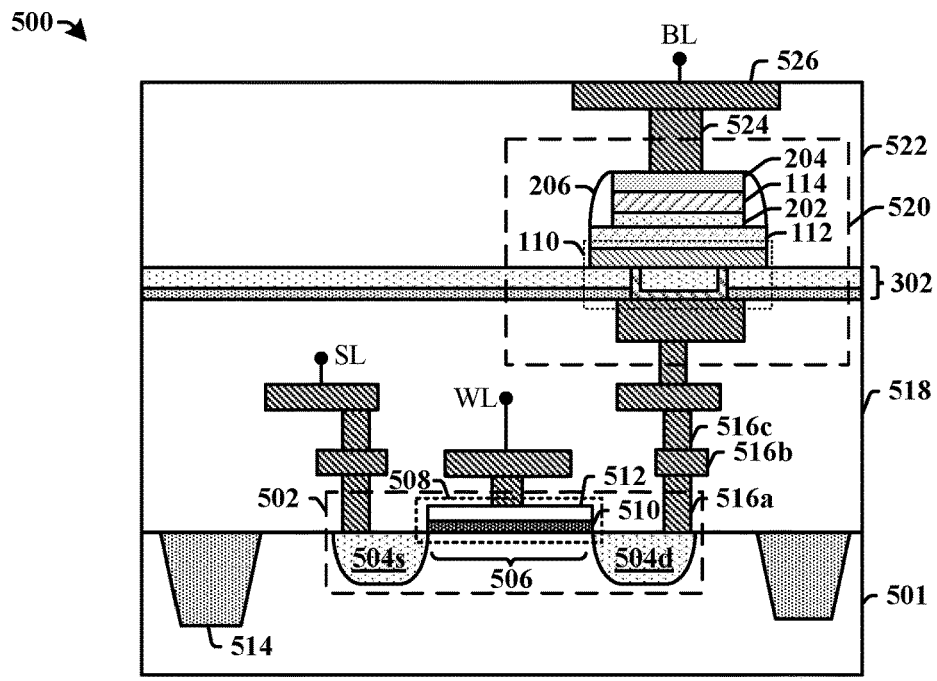
FIG. 5 illustrates a cross-sectional view of some additional embodiments of an integrated chip comprising an RRAM cell comprising a multi-layer bottom electrode having an insulating core.

FIG. 5 illustrates a cross-sectional view of some alternative embodiments of an integrated chip 500 comprising a multi-layer bottom electrode with an insulating core.

The integrated chip 500 comprises a transistor 502 having a source region 504s that is separated from a drain region 504d by a channel region 506. The source region 504s and the drain region 504d comprise highly doped regions. A gate region 508 comprises a gate electrode 512 separated from the channel region 506 by a gate dielectric layer 510. In some embodiments, the transistor 502 may be arranged between isolation regions 514 (e.g., shallow trench isolation regions) within a semiconductor substrate 501.

A back-end-of-the-line (BEOL) metallization stack is arranged within an ILD layer 518 over the semiconductor substrate 501. In some embodiments, the ILD layer 518 may comprise one or more layers of an oxide, a low-k dielectric, or an ultra low-k dielectric. The BEOL metallization stack comprises a plurality of contacts 516a, metal wire layers 516b, and metal via layers 516c. In some embodiments, the plurality of contacts 516a, metal wire layers 516b, and metal via layers 516c may comprise copper, tungsten, and/or aluminum. The metal wire layers 516b comprise a source-line SL comprising a first metal interconnect wire that is electrically coupled to a source region 504s of the transistor 502. In some embodiments, the source-line SL may be arranged in a second metal wire layer that is connected to source region 504s through a contact, a first metal wire layer, and a first metal via layer. The metal wire layers 516b further comprise a word-line WL comprising a second metal interconnect wire that is electrically coupled to a gate electrode 512 of the transistor 502. In some embodiments, the word-line WL may be arranged in the first metal wire layer that is connected to gate electrode 512 by way of a contact.

An RRAM cell 520 is arranged within the BEOL metallization stack at a location that is vertically between metal interconnect layers. The RRAM cell 520 is vertically separated from the ILD layer 518 by a multi-layer lower insulating layer 302. The RRAM cell 520 comprises a multi-layer bottom electrode 110 with an insulating core. A dielectric data storage layer 112 having a variable resistance is located over the multi-layer bottom electrode 110, a top electrode 114 is disposed over the dielectric data storage layer 112, and a capping layer 202 may be arranged between the dielectric data storage layer 112 and the top electrode 114. In some embodiments, a masking layer 204 may be arranged onto the top electrode 114. An upper metal via 524 extends through the masking layer 204 to contact the top electrode 114. The upper metal via 524 may be arranged within an ILD layer 522 surrounding the upper metal via 524 and an overlying upper metal wire 526.

FIGS. 6-16 illustrate some embodiments of cross-sectional views showing a method of forming an RRAM cell comprising a multi-layer bottom electrode with an insulating core.

Figure 6:
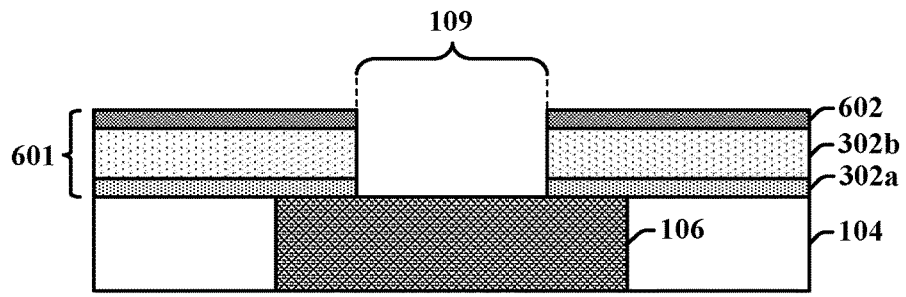
FIGS. 6-15 illustrate some embodiments of cross-sectional views showing a method of forming an RRAM cell comprising a multi-layer bottom electrode having an insulating core.

As shown in cross-sectional view 600 of FIG. 6, a lower metal interconnect layer 106 is formed within a lower ILD layer 104 (e.g., an oxide, a low-k dielectric, or an ultra low-k dielectric). In some embodiments, the lower metal interconnect layer 106 may be formed by selectively etching the lower ILD layer 104 (e.g., an oxide, a low-k dielectric, or an ultra low-k dielectric) to form a via hole in the lower ILD layer 104. A metal (e.g., copper, aluminum, etc.) is then deposited to fill the via hole, and a planarization process is performed to remove excess metal to form the lower metal interconnect layer 106.

A lower insulating structure 601 is subsequently formed onto the lower metal interconnect layer 106 and/or the lower ILD layer 104. In some embodiments, the lower insulating structure 601 may comprise a multi-layer structure having a first insulating material 302a, a second insulating material 302b, and a third insulating material 602. In some embodiments, the first insulating material 302a, the second insulating material 302b, and the third insulating material 602 may be formed using a vapor deposition technique (e.g., physical vapor deposition, chemical vapor deposition, etc.). The lower insulating structure 601 is then selectively etched (e.g., using a dry etchant) to form an opening 109 or micro-trench, which extends through the lower insulating structure 601 to the lower metal interconnect layer 106.

Figure 7:
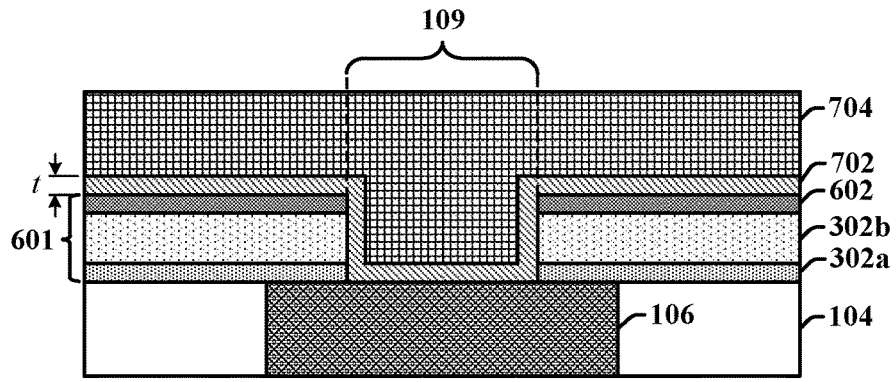

As shown in cross-sectional view 700 of FIG. 7, a conductive lower BE film 702 is formed within the opening 109. The conductive lower BE film 702 is arranged along a bottom surface and along sidewalls of the opening 109 and over an upper surface of the lower insulating structure 601. In some embodiments, the conductive lower BE film 702 may be formed using a vapor deposition technique (e.g., ALD, CVD, PE-CVD, etc.) to a thickness t of between approximately 50 angstroms and approximately 150 angstroms. In other embodiments, the conductive lower BE film 702 may be formed to other thicknesses. In some embodiments, the conductive lower BE film 702 may comprise a conductive material, such as Ti, TiN, Ta, TaN, W, or Cu, for example.

An insulating BE film 704 is formed onto the conductive lower BE film 702. The insulating BE film 704 fills in a reminder of the opening 109 and extends over the lower insulating structure 601. In some embodiments, the insulating BE film 704 may be formed using a vapor deposition technique (e.g., ALD, CVD, PE-CVD, etc.). In some embodiments, the insulating BE film 704 may comprise an oxide or a silicon rich oxide, for example. In some embodiments, the insulating BE film 704 may comprise a same material as the second insulating material 302b.

Figure 8:
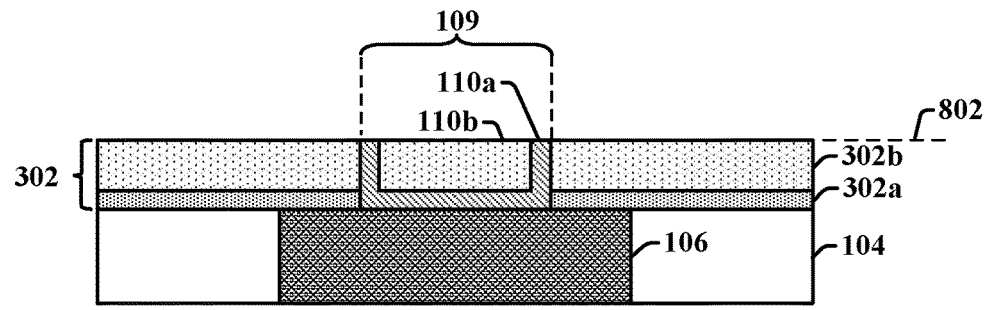

As shown in cross-sectional view 800 of FIG. 8, a planarization process is performed to form a flat surface 802 by removing materials from the conductive lower BE film (e.g., 702 of FIG. 7) and the insulating BE film (e.g., 704 of FIG. 7) that are outside of the opening 109 in the lower insulating layer 302. The planarization process results in a conductive lower BE layer 110a and an insulating BE layer 110b, which have planar upper surfaces that are aligned along a substantially planar horizontal surface. The upper surfaces of the conductive lower BE layer 110a and the insulating BE layer 110b are vertically aligned with an upper surface of the lower insulating layer 302. In some embodiments, the planarization process may comprise a chemical mechanical polishing (CMP) process.

Figure 9:
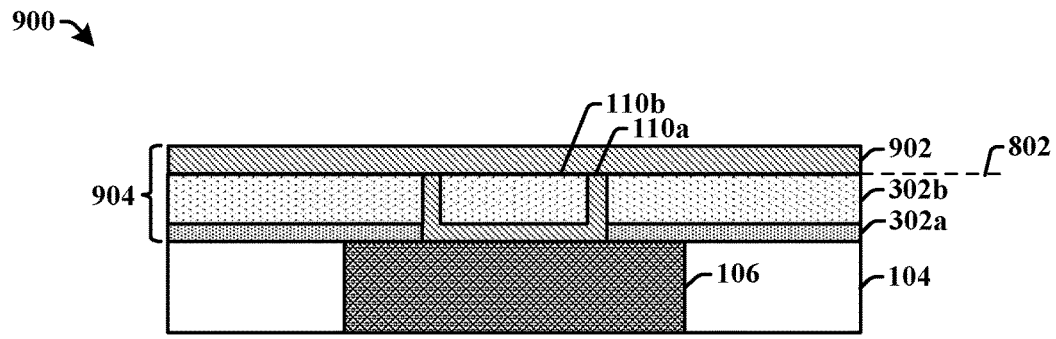

As shown in cross-sectional view 900 of FIG. 9, a conductive upper BE film 902 may be formed over the second insulating material 302b, the conductive lower BE layer 110a, and the insulating BE layer 110b to form a multi-layer bottom electrode layer 904. The conductive upper BE film 902 may be a substantially flat layer formed onto the flat surface 802. In some embodiments, the conductive upper BE film 902 may be formed using a vapor deposition technique (e.g., ALD, CVD, PE-CVD, etc.). In some embodiments, the conductive upper BE film 902 may comprise a conductive material, such as Ti, TiN, Ta, TaN, W, or Cu, for example.

Figure 10:
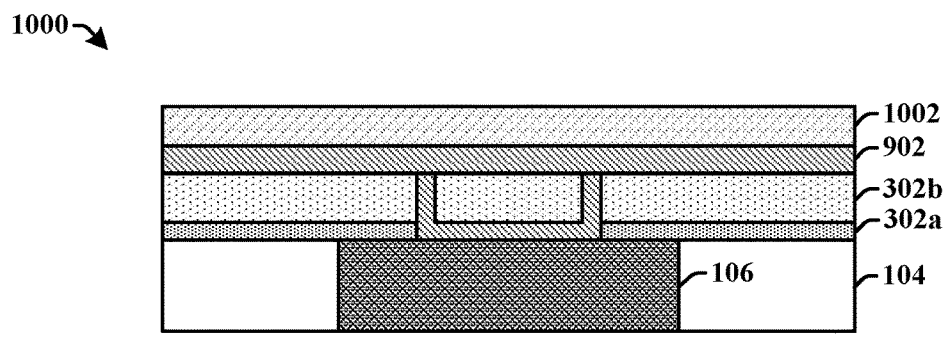

As shown in cross-sectional view 1000 of FIG. 10, a dielectric data storage layer 1002 is formed over the conductive upper BE film 902. In some embodiments, the dielectric data storage layer 1002 may comprise a high-k dielectric material having a variable resistance. For example, in some embodiments, the dielectric data storage layer 1002 may comprise hafnium oxide ($HfO_x$), zirconium oxide ($ZrO_x$), aluminum oxide ($AlO_x$), nickel oxide ($NiO_x$), tantalum oxide ($TaO_x$), or titanium oxide ($TiO_x$). In some embodiments, the dielectric data storage layer 1002 may be deposited by way of vapor deposition techniques (e.g., physical vapor deposition, chemical vapor deposition, etc.).

Figure 11:
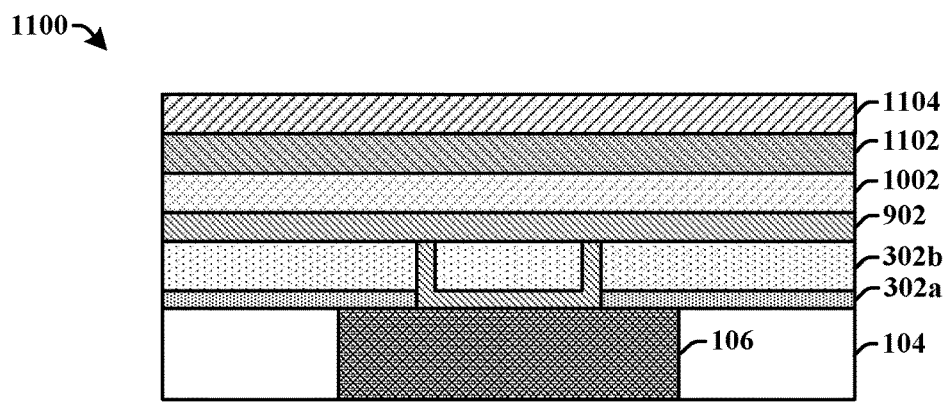

As shown in cross-sectional view 1100 of FIG. 11, a capping layer 1102 is formed over the dielectric data storage layer 1002. In some embodiments, the capping layer 1102 may comprise a metal such as titanium (Ti), hafnium (Hf), platinum (Pt), ruthenium (Ru), and/or aluminum (Al). In other embodiments, the capping layer 1102 may comprise a metal oxide such as titanium oxide ($TiO_x$), hafnium oxide ($HfO_x$), zirconium oxide ($ZrO_x$), germanium oxide ($GeO_x$), cesium oxide ($CeO_x$). A top electrode layer 1104 is formed over the capping layer 1102. In various embodiments, the top electrode layer 1104 may comprise a metal nitride (e.g., titanium nitride (TiN) or tantalum nitride (TaN)) or a metal (e.g., titanium (Ti) or tantalum (Ta)).

Figure 12:
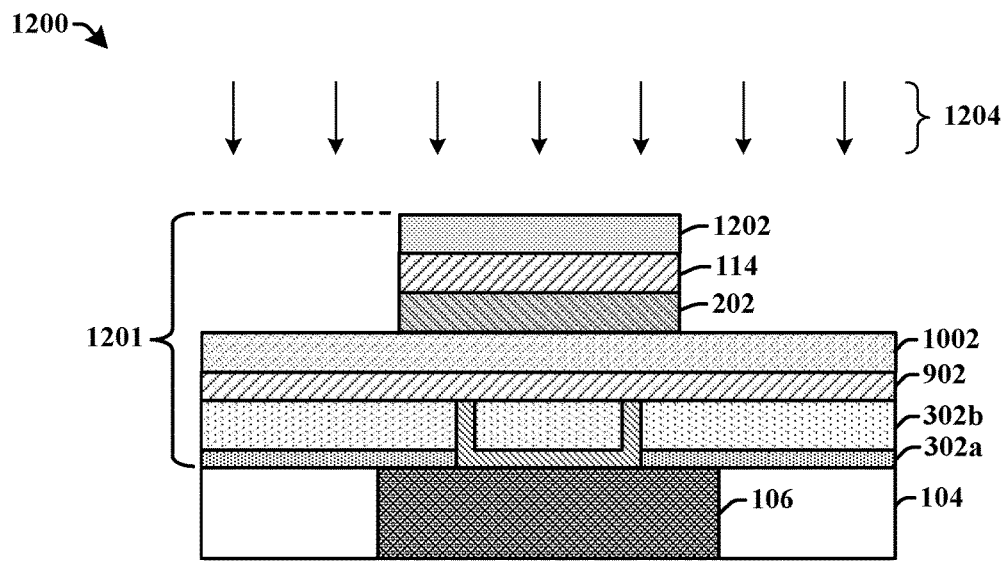

As shown in cross-sectional view 1200 of FIG. 12 a first patterned process is performed to selectively pattern RRAM film stack 1201 to form a top electrode 114 over a capping layer 202. In some embodiments, the RRAM film stack 1201 is patterned by exposing the capping layer (e.g., 1102 of FIG. 11) and the top electrode layer (e.g., 1104 of FIG. 11) to an etchant 1204 in areas not covered by a masking layer 1202. In some embodiments, the masking layer 1202 may comprise a hard mask layer, such as silicon-oxide ($SiO_2$) or silicon-oxynitride (SiON). In some embodiments, the etchant 1204 may comprise a dry etchant (e.g., a plasma etchant, a RIE etchant, etc.) or a wet etchant (e.g., comprising hydrofluoric acid (HF)).

Figure 13:
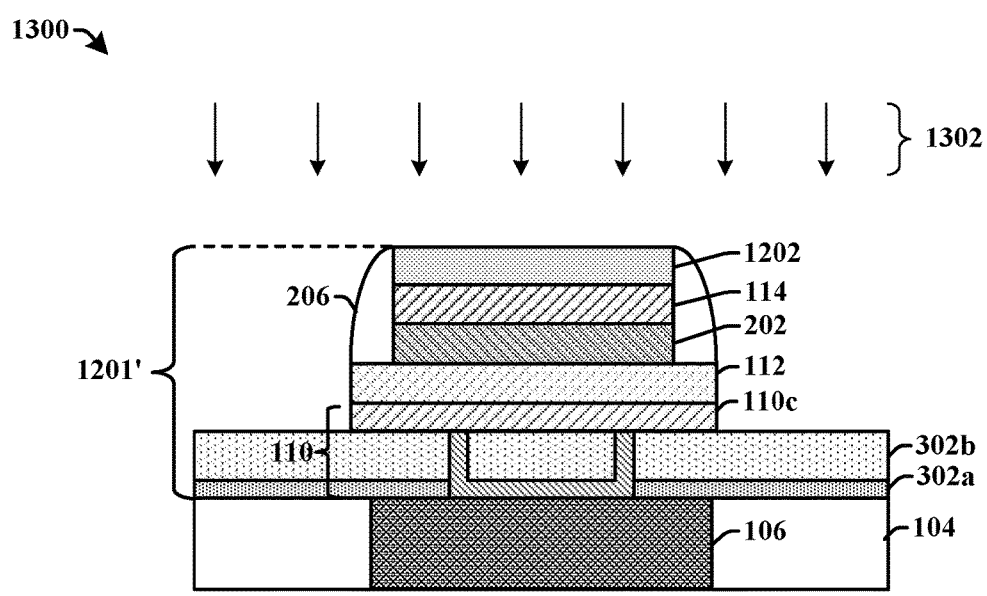

As shown in cross-sectional view 1300 of FIG. 13, sidewall spacers 206 are formed on opposing sides of the top electrode 114 and the capping layer 202. In some embodiments, the sidewall spacers 206 may be formed by depositing a nitride and selectively etching the nitride to form the sidewall spacers 206. A second patterning process is then performed to pattern the RRAM film stack 1201' to define a dielectric data storage layer 112 and a multi-layer bottom electrode 110. In some embodiments, the RRAM film stack 1201' is patterned by exposing the dielectric data storage layer (e.g., 1002 of FIG. 12) and the conductive upper BE film (e.g., 902 of FIG. 12) to a second etchant 1302 in areas not covered by the masking layer 1202 and the sidewall spacers 206.

Figure 14:
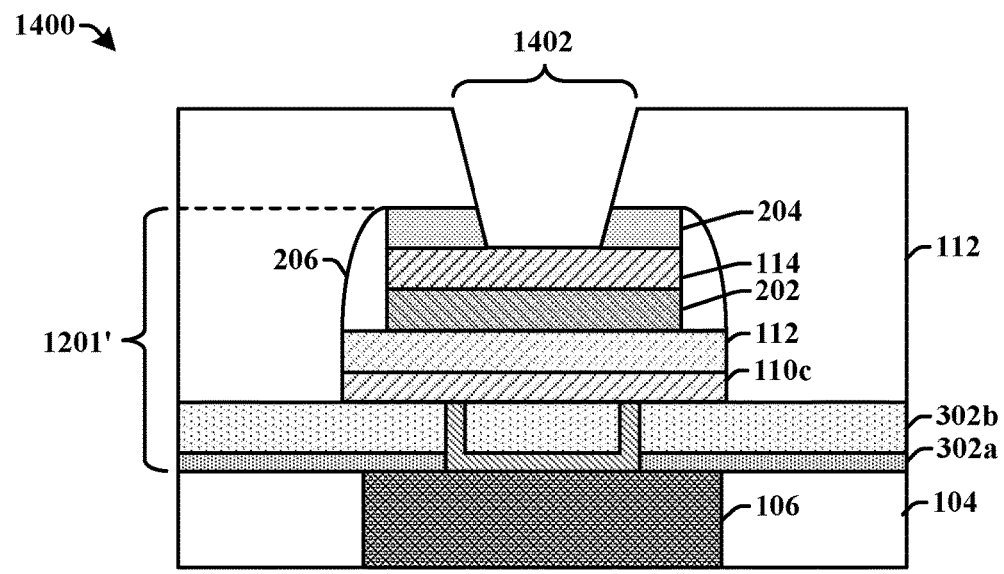

As shown in cross-sectional view 1400 of FIG. 14, an upper inter-level dielectric (ILD) layer 116 is subsequently formed over RRAM film stack 1201'. The upper ILD layer 112 and the masking layer 204 may be subsequently patterned to form a via hole 1402 that extends from a top surface of the upper ILD layer 116 to a position abutting the top electrode 114.

Figure 15:
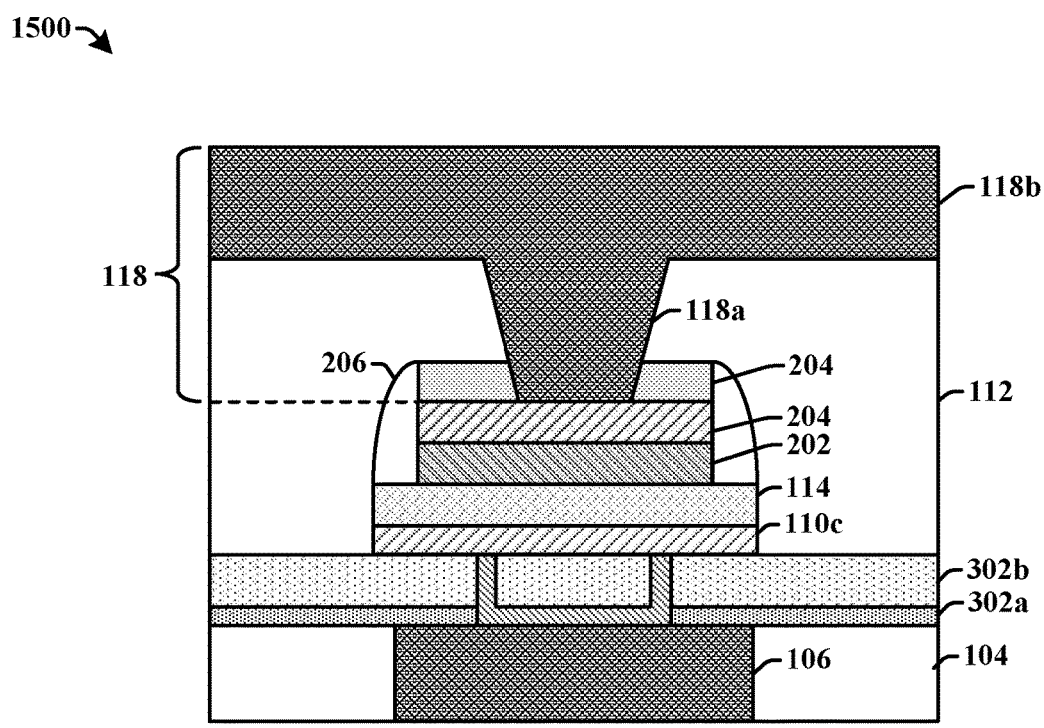

As shown in cross-sectional view 1500 of FIG. 15, an upper metal interconnect layer 118 is formed at a position abutting the top electrode 114. In some embodiments, the upper metal interconnect layer 118 comprises an upper metal via 118a and an upper metal wire 118b. In some embodiments, the upper metal interconnect layer 118 may be formed by filling the via hole 1402, and an overlying trench, with a metal (e.g., copper) to form the upper metal via 118a and the upper metal wire 118b, respectively.

Figure 16:
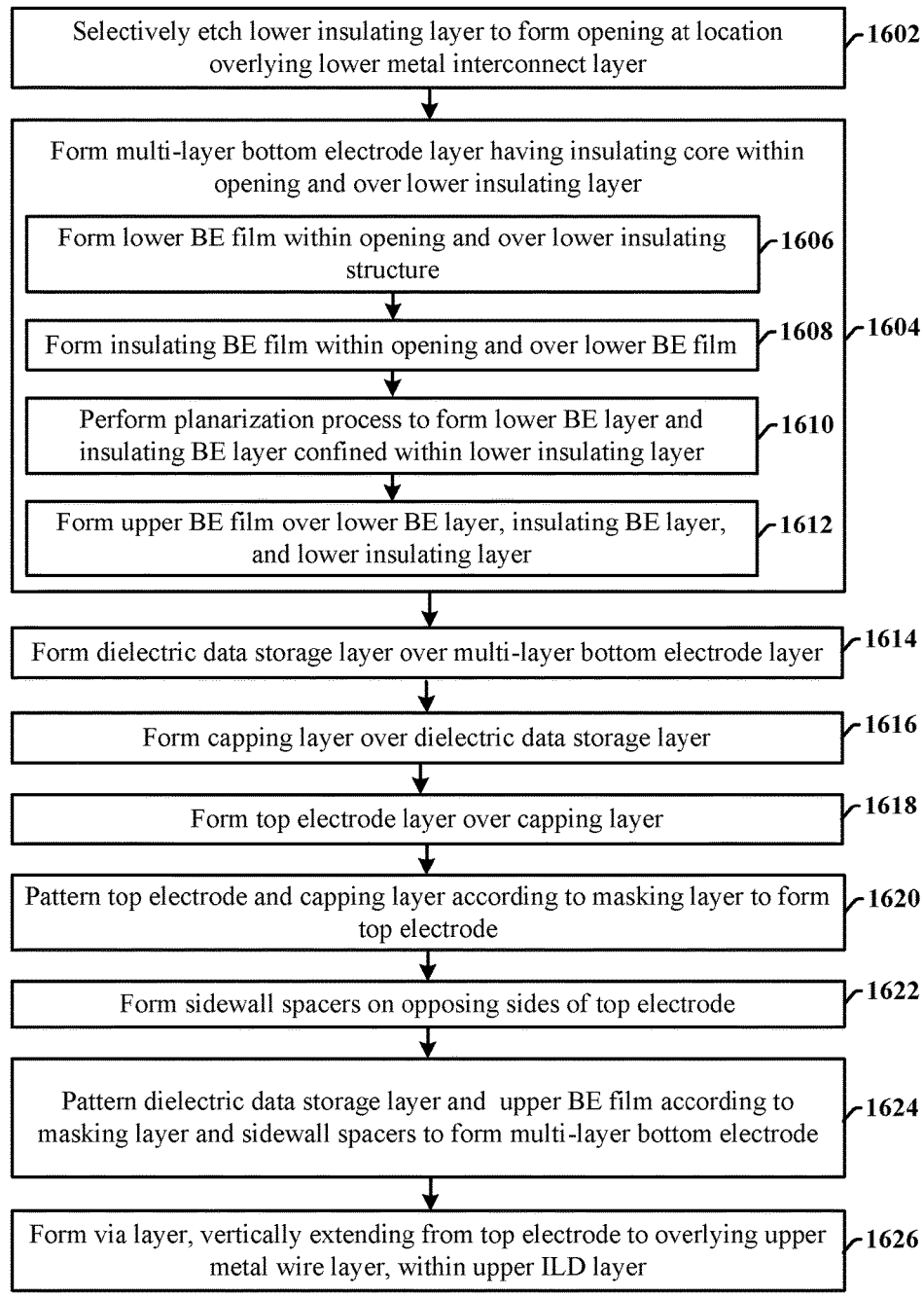
FIG. 16 illustrates a flow diagram of some embodiments of a method of forming an RRAM cell comprising a multi-layer bottom electrode having an insulating core.

FIG. 16 illustrates a flow diagram of some embodiments of a method 1600 of forming an RRAM cell comprising a multi-layer bottom electrode having an insulating core.

While the disclosed method 1600 is illustrated and described herein as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At 1602, a lower insulating layer is selectively etched to form an opening extending through the lower insulating layer at a location overlying a lower metal interconnect layer.

At 1604, a multi-layer bottom electrode layer with an insulating core is formed within the opening and over the lower insulating layer and the lower metal interconnect layer. The multi-layer bottom electrode layer comprises an insulating core that is surrounded by one or more conductive materials.

In some embodiments, the multi-layer bottom electrode layer may be formed by forming a conductive lower BE film within the opening and over the lower insulating layer, at 1606. An insulating BE film may be formed over the conductive lower BE film to fill a remainder of the opening, at 1608. A planarization process is then performed, to form a lower BE layer and an insulating BE layer confined within a lower insulating layer, by removing material from the conductive lower BE film, the insulating BE film, and the lower insulating structure outside of the opening, at 1610. A conductive upper BE film is then formed onto the conductive lower BE film, the insulating BE film, and the lower insulating layer, at 1612.

At 1614, a dielectric data storage layer is formed over the multi-layer bottom electrode.

At 1616, a capping layer may be formed over the dielectric data storage layer, in some embodiments.

At 1618, a top electrode layer is formed over the capping layer.

At 1620, a first patterning process is performed to pattern the capping layer and the top electrode layer according to a masking layer. The first patterning process forms a top electrode.

At 1622, sidewall spacers may be formed on opposing sides of the top electrode, in some embodiments.

At 1624, a second patterned process is performed to pattern the dielectric data storage layer and the multi-layer bottom electrode layer according to the masking layer and the sidewall spacers. The second patterning process forms a multi-layer bottom electrode.

At 1626, a via layer is formed within an upper ILD layer. The via layer vertically extends from the top electrode to an overlying upper metal wire layer.

Therefore, the present disclosure relates to an RRAM (resistive random access memory) cell having a multi-layer bottom electrode with an insulating core, and an associated method of formation.

In some embodiments, the present disclosure relates to a memory cell. The memory cell comprises a bottom electrode having an insulating material surrounded by a conductive material. A dielectric data storage layer is arranged over the bottom electrode, and a top electrode is arranged over the dielectric data storage layer.

In other embodiments, the present disclosure relates to a memory cell. The memory cell comprises a multi-layer bottom electrode having an insulating bottom electrode layer arranged laterally between sidewalls of a conductive lower bottom electrode layer and vertically between the conductive lower bottom electrode layer and a conductive upper bottom electrode layer. A data storage layer is arranged over the multi-layer bottom electrode and is configured to store a data state. A top electrode is arranged over the data storage layer.

In yet other embodiments, the present disclosure relates to a method of forming a memory cell. The method comprises forming a conductive lower bottom electrode film within an opening in a lower insulating structure, and forming an insulating bottom electrode film within the opening and over the conductive lower bottom electrode film. The method further comprises performing a planarization process to remove a part of the conductive lower bottom electrode film and a part of the insulating bottom electrode film. The method further comprises forming a conductive upper bottom electrode film over the conductive lower bottom electrode film and the insulating bottom electrode film. The method further comprises forming a data storage layer over the conductive upper bottom electrode film and forming a conductive top electrode over the data storage layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory cell, comprising:
    a bottom electrode comprising an insulating material completely surrounded by one or more conductive materials;

a data storage layer arranged over the bottom electrode; and a top electrode arranged over the data storage layer.

2. The memory cell of claim 1, wherein the insulating material is arranged laterally between sidewalls of a conductive lower bottom electrode layer and vertically between the conductive lower bottom electrode layer and a conductive upper bottom electrode layer.

3. The memory cell of claim 2, wherein the conductive upper bottom electrode layer extends past outermost sidewalls of the insulating material.

4. The memory cell of claim 2, wherein the insulating material has an upper surface that is substantially co-planar with an upper surface of the conductive lower bottom electrode layer.

5. The memory cell of claim 2, wherein the conductive lower bottom electrode layer comprises a 'U' shaped layer having a cavity arranged within a top surface of the conductive lower bottom electrode layer, and the insulating material is confined to within the cavity.

6. The memory cell of claim 2, wherein the bottom electrode further comprises an additional conductive lower bottom electrode layer arranged laterally and vertically between the conductive lower bottom electrode layer and the insulating material.

7. The memory cell of claim 6, wherein the conductive lower bottom electrode layer has a smaller thickness than the additional conductive lower bottom electrode layer.

8. The memory cell of claim 6, wherein the conductive lower bottom electrode layer comprises tantalum nitride and the additional conductive lower bottom electrode layer comprises titanium nitride.

9. The memory cell of claim 1, further comprising:
a lower insulating layer laterally surrounding a lower part of the bottom electrode, wherein the lower insulating layer has an uppermost surface that is below an uppermost surface of the bottom electrode.

10. The memory cell of claim 9, wherein the bottom electrode has a lower surface that is directly over the lower insulating layer.

11. The memory cell of claim 1,
wherein the one or more conductive materials comprise a first conductive material and a second conductive material; and
wherein the second conductive material is disposed over the first conductive material.

12. A memory cell, comprising:
a multi-layer bottom electrode comprising an insulating bottom electrode layer arranged laterally between sidewalls of a conductive lower bottom electrode layer and vertically between the conductive lower bottom electrode layer and a conductive upper bottom electrode layer;
a data storage layer arranged over the multi-layer bottom electrode and configured to store a data state; and
a top electrode arranged over the data storage layer.

13. The memory cell of claim 12, wherein the conductive lower bottom electrode layer comprises a 'U' shaped layer having a cavity arranged within a top surface of the conductive lower bottom electrode layer, and the insulating bottom electrode layer is arranged within the cavity.

14. The memory cell of claim 12, further comprising:
a conductive second lower bottom electrode layer laterally and vertically arranged between the insulating bottom electrode layer and the conductive lower bottom electrode layer.

15. The memory cell of claim 12, further comprising:
a lower insulating layer arranged over a lower metal interconnect layer surrounded by a lower inter-level dielectric layer; and
wherein the multi-layer bottom electrode is arranged within an opening vertically extending through the lower insulating layer.

16. The memory cell of claim 15, wherein the insulating bottom electrode layer comprises a same material as the lower insulating layer.

17. A memory cell, comprising:
a first electrode, comprising:
a first conductive layer having exterior sidewalls and interior sidewalls, wherein the interior sidewalls define a recess within the first conductive layer;
an insulating layer arranged over the first conductive layer and between the interior sidewalls; and
a second conductive layer on the first conductive layer and the insulating layer;
a second electrode comprising a third conductive layer; and
a data storage element arranged between the first electrode and the second electrode, wherein the data storage element is configured to store a data state.

18. The memory cell of claim 17, wherein the insulating layer completely fills the recess within the first conductive layer.

19. The memory cell of claim 17, wherein the second conductive layer directly contacts the first conductive layer.

20. The memory cell of claim 17, wherein the first conductive layer and the second conductive layer completely surround the insulating layer.

* * * * *